(12) United States Patent
Dabral et al.

(10) Patent No.: US 9,679,891 B2
(45) Date of Patent: Jun. 13, 2017

(54) OPTIMIZED ESD CLAMP CIRCUITRY

(71) Applicant: Apple Inc., Cupertino, CA (US)

(72) Inventors: Sanjay Dabral, Cupertino, CA (US); Xiaofeng Fan, Santa Clara, CA (US); Geertjan Joordens, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 618 days.

(21) Appl. No.: 14/220,293

(22) Filed: Mar. 20, 2014

(65) Prior Publication Data

US 2015/0270258 A1    Sep. 24, 2015

(51) Int. Cl.
| | | |
|---|---|---|
| *H01L 27/02* | (2006.01) | |
| *H02H 3/20* | (2006.01) | |
| *H02H 3/22* | (2006.01) | |
| *H02H 9/04* | (2006.01) | |

(52) U.S. Cl.
CPC .......... *H01L 27/0285* (2013.01); *H02H 3/20* (2013.01); *H02H 3/22* (2013.01); *H02H 9/046* (2013.01)

(58) Field of Classification Search
CPC . H02H 9/046; H02H 3/20; H02H 3/22; H01L 27/0285
See application file for complete search history.

(56) References Cited

U.S. PATENT DOCUMENTS

| | | | | |
|---|---|---|---|---|
| 5,255,146 | A * | 10/1993 | Miller | H02H 9/046 361/111 |
| 5,708,549 | A | 1/1998 | Croft | |
| 6,947,267 | B2 * | 9/2005 | Liu | H01L 27/0292 361/111 |
| 7,164,185 | B1 | 1/2007 | Salman et al. | |
| 8,238,067 | B2 * | 8/2012 | Drapkin | H01L 27/0285 361/111 |
| 8,400,743 | B2 * | 3/2013 | Kosonocky | H01L 27/0292 361/56 |
| 8,737,029 | B2 * | 5/2014 | Sofer | H01L 23/60 361/111 |
| 9,406,627 | B2 * | 8/2016 | Worley | H01L 23/60 |
| 2011/0261489 | A1 * | 10/2011 | Zupcau | H01L 27/0285 361/56 |
| 2013/0250461 | A1 | 9/2013 | Shrivastava et al. | |

* cited by examiner

*Primary Examiner* — Zeev V Kitov
(74) *Attorney, Agent, or Firm* — Meyertons, Hood, Kivlin, Kowert & Goetzel, P.C.; Erik A. Heter (57) ABSTRACT

ESD protection circuitry is disclosed. In one embodiment, an integrated circuit includes first and second sensor circuits. The first sensor circuit has a first resistive-capacitive (RC) time constant, while the second sensor circuit has a second RC time constant. The RC time constant of the first sensor circuit is at least one order of magnitude greater than that of the second sensor circuit. A first clamp transistor is coupled to and configured to be activated by the first sensor circuit responsive to the latter detecting an ESD event. A second clamp transistor is coupled to and configured to be activated by the second sensor circuit responsive to the latter detecting the ESD event.

19 Claims, 10 Drawing Sheets

OPTIMIZED ESD CLAMP CIRCUITRY

BACKGROUND

1. Technical Field

This disclosure relates to electronic circuits, and more particularly, to circuits arranged to prevent damage resulting from electro-static discharge.

2. Description of the Related Art

Electro-static discharge (ESD) is a sudden electrical current flow between two charged surfaces. Often times, a significant difference in voltage potential may exist between the two charged surfaces. When the surfaces are electrically shorted together, come into contact, or dielectric breakdown occurs therebetween, the surfaces may discharge until the difference in voltage is effectively zero. Since the voltage difference prior to discharge may be large, the corresponding currents during discharge may also be large.

Semiconductor devices (e.g., integrated circuits, or ICs) may be particularly vulnerable to the adverse effects of ESD. The large currents that can be produced by ESD can damage or destroy circuitry. Accordingly, during manufacturing and installation of electronic systems utilizing ICs, special handling procedures may be followed to prevent ESD damage from occurring. Furthermore, many ICs may have ESD protection circuitry built in. Such circuitry may include a sensor and a clamp circuit. The sensor may sense the occurrence of an ESD event. Responsive to sensing the ESD event, the sensor may cause activation of the clamp circuit to provide an electrical path through which the current may be safely discharged.

SUMMARY OF THE DISCLOSURE

ESD protection circuitry is disclosed. In one embodiment, an integrated circuit (IC) includes first and second sensor circuits. The first sensor circuit has a first resistive-capacitive (RC) time constant, while the second sensor circuit has a second RC time constant. The RC time constant of the first sensor circuit is greater than that of the second sensor circuit. In some embodiments, the RC time constant of the first sensor circuit may be at least one order of magnitude greater than that of the second sensor circuit. A first clamp transistor is coupled to and configured to be activated by the first sensor circuit responsive to the latter detecting an ESD event. A second clamp transistor is coupled to and configured to be activated by the second sensor circuit responsive to the latter detecting the ESD event.

In one embodiment, the first sensor circuit may be designed to have an RC time constant in accordance with the human body model (HBM), and may be referred to as an HBM sensor. The second sensor circuit may be designed to have an RC time constant in accordance with the charged device model (CDM), and may be referred to as a CDM sensor. An HBM sensor may have a slower activation time relative to a CDM sensor, and may remain active for a greater duration. A clamp transistor coupled to a CDM sensor may pass a greater amount of peak current than one coupled to an HBM sensor. Both the HBM and CDM sensors may be RC circuits coupled between a power node and a reference node (e.g., ground), with the R and C values chosen accordingly. In an exemplary embodiment, an HBM sensor may have a time constant in the range of 1-3 microseconds (μsec), while the CDM sensor may have a time constant in the range of 1-10 nanoseconds (ns). It is emphasized that these figures are exemplary, and are not intended to be limiting.

In one embodiment, the sensor circuits may be implemented in a global power domain, while the clamp transistors may be implemented in a gated power domain. In another embodiment, the sensor circuits and correspondingly coupled clamping transistors may be implemented in the same power domain. In embodiments where the clamping transistors are implemented in a gated power domain, the sensor circuits may be configured to cause activation of power switches coupled between the global and gated power domains responsive to detecting an ESD event such that a discharge path is formed.

In some embodiments, each clamping transistor may be associated with a dedicated sensor circuit. In other embodiments, at least some of the sensor circuits may be configured to activate two or more clamping circuits, which may realize some area savings. Furthermore, a greater quantity of CDM sensors may be implemented than HBM sensors. This may save area relative to an IC in which the ESD circuitry is not optimized for HBM or CDM. Since the CDM sensors have a significantly smaller RC time constant than the HBM sensors, the RC circuit portion of the CDM sensors may also be significantly smaller than the RC circuit portion of an HBM sensor. In one embodiment, N CDM sensor-based ESD circuits may be implemented for every one HBM sensor-based ESD circuit.

BRIEF DESCRIPTION OF THE DRAWINGS

Other aspects of the disclosure will become apparent upon reading the following detailed description and upon reference to the accompanying drawings which are now described as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Figure 1:
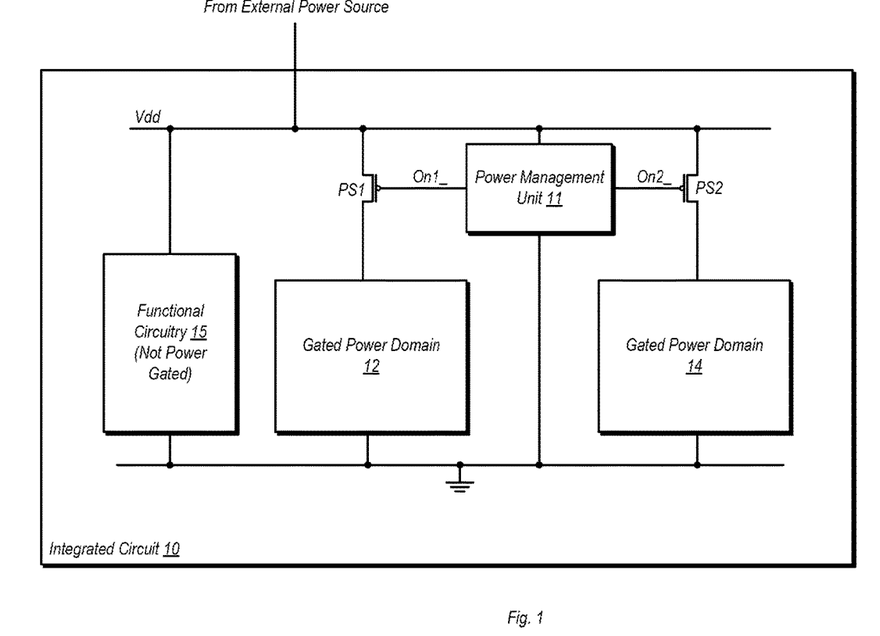
FIG. 1 is a block diagram of one embodiment of an IC having multiple power domains.

FIG. 1 is a block diagram of one embodiment of an IC having multiple power domains. In the embodiment shown, IC 10 includes a global power domain (powered from voltage node Vdd) and two gated power domains 12 and 14. Functional circuitry 15 in the embodiment shown is within the global power domain, and receives power any time voltage node Vdd is receiving power from an external power source. The functional circuitry 15 may perform some of the useful work performed by IC 10. As defined herein, a global power domain may be circuitry that receives power at any time it is being supplied to IC 10 from an external source (which may include receiving power via an on-chip voltage regulator). Furthermore, a global voltage node may be defined as a voltage node that receives (and distributes) power at a specified supply voltage from whenever power is being supplied from the external source.

A gated power domain may be defined as a power domain in which power is received from the global power domain when corresponding power switches are active. The power switches, coupled between the global voltage node and a virtual voltage node of gated power domain, may be activated when the circuitry in the gated power domain is to perform useful work. Additionally, as discussed below, power switches may be activated responsive to the detection of ESD events in order to provide paths to safely discharge current through the gated power domain. If the circuitry in the gated power domain is idle, power management unit 11 may cause the power switches to be deactivated if certain criteria are met. Deactivating the power switches and thus removing power from the circuitry in a gate power domain may thus achieve power savings.

Although not explicitly shown here, gated power domains 12 and 14 may also include functional circuitry that performs useful work for IC 10. However, the circuitry within gated power domains 12 and 14 may at times be subject to idleness, and thus power savings may be achieved by removing power therefrom. Gated power domain 12 in the embodiment shown is configured to receive power from the global power domain, and specifically from Vdd, when power switch PS1 is active. Similarly, gated power domain 14 may receive power from Vdd when power switch PS2 is active. It is noted that for the sake of simplicity only a single power switch is shown coupled between Vdd and the gated power domains 12 and 14. However, a number of power switches may be coupled between Vdd and each of the gated power domains 12 and 14.

Power management unit 11 may activate or deactivate gated power domains 12 and 14 independent of one another. Power management unit 11 may activate gated power domain 12 by asserting the active logic low signal On1_, thereby activating PS1. When power management unit 11 raises On1_ to a logic high, PS1 may be deactivated and power may thus be removed from the circuits of gated power domain 12. Power management unit 11 may similarly cause power to be provided to gated power domain 14 by asserting the active logic low signal On2_, thereby activating PS2. On2_ may be raised to a logic high by power management unit 11 to remove power from the circuits of gated power domain 14.

IC 10 may be implemented using complementary metal oxide semiconductor (CMOS) technology. Such technology may be susceptible to ESD events when power is removed from global and/or gated power domains. An ESD event may be defined herein as a rapid discharge of current between two differently charged objects due to contact, an electrical short, or dielectric breakdown. For example, a human may in the course of normal activities build up a static electric field on his or her person. When coming into contact with another differently charged object, such as IC 10, the differing charges (and thus potentials) may cause a sudden flow of current therebetween. This current can be significant (e.g., in the ampere range) due to large charge, and thus potential differences.

ESD events involving IC 10 can cause damage or destruction of the circuitry thereon if it is not otherwise protected. As discussed below, IC 10 may include circuitry designed for ESD protection. Such ESD protection may detect ESD events on IC 10 and may respond thereto by activating electrical paths which provide a safe route to discharge the current to ground and away from circuits that otherwise might be damaged. As is further discussed below, some ESD circuits may be designed according to a human body model (HBM), while others may be designed according to a charged device model (CDM). Such circuits may have different characteristics that, when used together, allow both the discharge of significant amounts of electrical current as well as keeping discharge paths open for a sufficient duration. Furthermore, various embodiments of the ESD circuits discussed herein may protect circuitry in the global power domain, while other ESD circuits may protect circuitry in the gated power domains 12 and 14.

Figure 2:
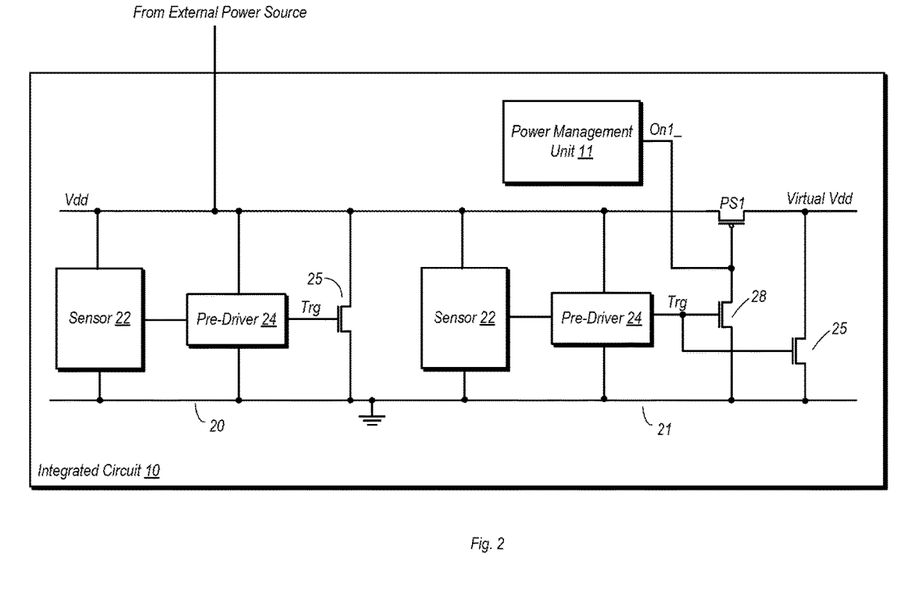
FIG. 2 is a diagram of one embodiment of an IC having ESD protection circuitry.

FIG. 2 is a diagram of one embodiment of an IC having ESD protection circuitry. In the exemplary embodiment shown, IC 10 includes two different ESD circuits, although it is understood that the number, type, and placement of ESD circuits in various IC embodiments may vary widely from one to the next.

ESD circuit 20 in the embodiment shown is implemented entirely within the global power domain. More particularly, ESD circuit 20 may create a discharge path between Vdd (a global voltage node) and a ground node responsive to an ESD event. ESD circuit 20 includes a sensor 22, a pre-driver 24, and a clamp transistor 25, each of which is coupled between Vdd and ground. Sensor 22 is configured to detect an ESD event and cause an indication to be driven to pre-driver 24. Pre-driver 24 may generate sufficient drive strength for the indication and output the same as a trigger signal ('Trg') to the gate terminal of clamp transistor 25. Clamp transistor 25, which is an n-channel metal oxide semiconductor (NMOS) transistor in this example, may be activated and thus provide a discharge path between Vdd and ground. Since clamp transistor 25 may be discharging a large amount of current during an ESD event, it may be made sufficiently large such that it has a correspondingly large drain-source current ($I_{ds}$) when operating in the saturation mode. Furthermore, sensor 22 and pre-driver 24 may be designed to cause activation of clamp transistor 25 with sufficient speed such it is activated in a timely manner.

ESD circuit 21 in the embodiment shown is implemented partially in the global power domain, and partially in a gated power domain. In particular, sensor 22 and pre-driver 24 are both implemented in the global power domain, and are thus coupled between Vdd and ground. Clamp transistor 25 of ESD circuit 21 is in the gated power domain, and is thus coupled between Virtual Vdd and ground. Power switch PS1 is coupled between Vdd and Virtual Vdd, and may electrically couple one to the other when activated.

ESD circuit 21 in the embodiment shown also includes an extra transistor 28, which is an NMOS transistor coupled between the gate terminal of PS1 and ground. Power switch PS1 is a p-channel metal oxide semiconductor (PMOS) transistor in this embodiment. Thus, when active, transistor 28 pulls down the voltage on the gate terminal of PS1, thereby causing its activation. Both transistors 25 and 28 in this embodiment are coupled to receive on their respective gate terminals the trigger signal from the correspondingly coupled pre-driver 24. Thus, responsive to an ESD event, sensor 22 and pre-driver 24 may cause the activation of both PS1 and the correspondingly coupled clamp transistor 25. The activation of PS1 enables clamp transistor 25, when activated to complete the formation of a discharge path and thus provide protection to functional circuitry within the gated power domain.

In addition to being able to provide a discharge path through a gated power domain that was powered down when the ESD event occurred, the placement of clamp transistor 25 in the gated power domain may provide other advantages. One such advantage is reduced leakage current through clamp transistor 25. When PS1 is inactive, any leakage that may occur through clamp transistor 25 of ESD circuit 21 may be small if not negligible.

It is noted in the embodiment shown that the gate terminal of PS1 is coupled to power management unit 11 (and more particularly, to receive the On1_ signal) in a wired-OR configuration. It is noted that in other embodiments, additional logic may be used to couple a signal from power management unit 11 to the gate terminal of PS1. In either case, power management unit 11 may be operatively coupled to cause the activation of PS1 during normal operation and when it is desired that useful work is performed by the circuitry in the gated power domain.

Figure 3A:
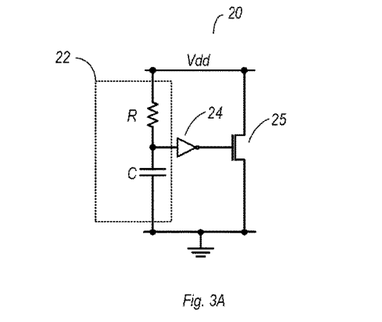
FIGS. 3A, 3B, 3C, and 3D illustrate schematic diagrams of different embodiments of an ESD protection circuit.
Figure 3B:
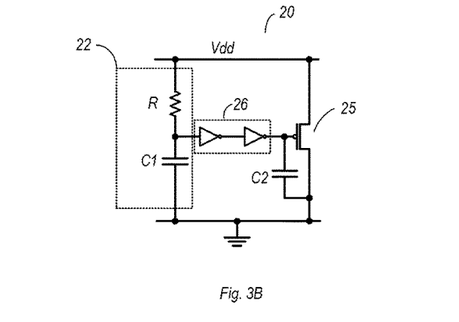
Figure 3C:
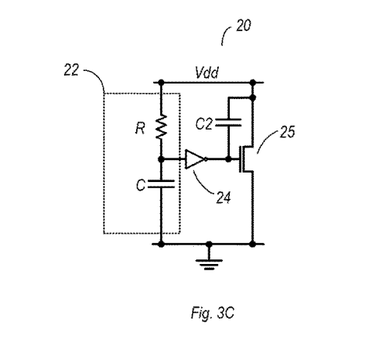

FIGS. 3A, 3B, and 3C illustrate schematic diagrams of different embodiments of an ESD protection circuit. The embodiments of ESD circuit 20 shown in FIGS. 3A-3C are arranged to be implemented in the same power domain (e.g., in the global power domain).

In the embodiments ESD circuit 20 shown in FIGS. 3A and 3B, each sensor circuit 22 is implemented using a resistor and a capacitor coupled in series to form an RC circuit. Further details on choosing the respective resistance and capacitance values of resistor R and capacitor C to achieve a desired RC time constant are provided below.

It is noted that while the resistor R and capacitor C are shown implementing the various sensor circuits discussed herein, it is noted that alternate embodiments in which the resistor R and/or the capacitor C are replaced by transistors are possible and contemplated. If the resistor R is replaced by the transistor, the resistive portion of the RC circuit may be set according to a drain-source resistance. To replace a capacitor, the drain and source terminals may be electrically coupled to form one capacitor terminal with the gate forming the other terminal, and the transistor coupled accordingly, with the C term set by the capacitance between the gate and the drain-source junction.

ESD circuit 20 in the embodiment shown utilizes an NMOS clamp transistor 25 coupled between Vdd and ground. Pre-driver 24 in this embodiment may be implemented with a single inverter, which may in turn be implemented using an NMOS over PMOS transistor stack coupled between Vdd and ground. The transistor-level implementation of the inverters are not shown here for the sake of simplicity, but will be understood by those who are skilled in the art.

When Vdd is receiving power, the voltage on the input of the inverter implementing pre-driver 24 may be pulled up through resistor R. Thus, the inverter may output a logic low to the gate terminal of clamp transistor 25 in the embodiment shown in FIG. 3A. Since clamp transistor 25 is an NMOS transistor in the embodiment discussed here, it remains inactive.

When Vdd is not receiving power and an ESD event occurs, a current is generated between Vdd and ground through the resistor and capacitor. The amount and duration of the current may depend on the RC time constant of sensor 22. Initially, the current will cause the input to the inverter to be pulled low, and thus the output of the pre-driver will transition high. This in turn causes activation of clamp transistor 25. Thus a potential difference between Vdd and ground caused by the ESD event may result in a discharge current flowing through clamp transistor 25. The voltage on the inverter of pre-driver 24 eventually falls below the threshold voltage of clamp transistor 25 as capacitor C discharges. Thereafter, clamp transistor 25 is deactivated.

ESD circuit 20 of FIG. 3B implements clamp transistor 25 using a PMOS device instead of the NMOS device used in FIG. 3A. As such, pre-driver 24 is replaced in this embodiment with pre-driver 26, which includes a pair of inverters coupled in series between the RC junction of sensor 22 and the gate terminal of clamp transistor 25. However, operation of the circuit shown in FIG. 3B is otherwise similar to that described above for the circuit in FIG. 3A. The use of a PMOS device may enable clamp transistor 25 to be smaller than if implemented with an NMOS transistor due to a shorter gate length.

One additional difference in FIG. 3B is the presence of capacitor C2 coupled between the drain and gate terminals of clamp transistor 25. It is noted that this capacitance is optional, and is its illustration is not intended to be limiting.

Although parasitic capacitances inherently exist between the drain and gate terminals (as well as the gate and source terminals) of a MOS transistor, the addition of extra capacitance may enable a reduction in the size of the transistors used to implement the inverters of pre-driver 26. The additional capacitor C2 may be a metal-over-metal (MOM) capacitor, and may have on the order of 10 times the parasitic drain-gate capacitance. The use of the extra capacitor may enable a reduction in the size of the pre-driver 26. For example, in one embodiment, the pre-driver 26 may consume 5-10% of the area of ESD circuit 20. Using the extra capacitance provided by C2 the size of the sensor may be reduces such that it consumes from 2.5-5% of the area of ESD circuit 20. As such, the use of the extra capacitance provided by C2 may be utilized in implementations in which additional area reductions of the pre-driver 26 are desirable.

FIG. 3C is a variation of the embodiment of FIG. 3A, in this case implementing the extra capacitance using a MOM capacitor.

Figure 3D:
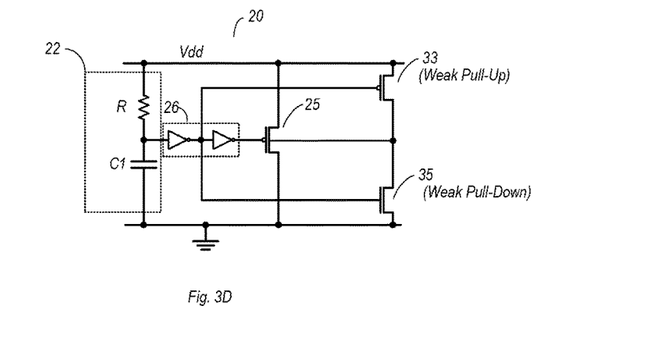

FIG. 3D illustrates one embodiment of an ESD circuit 20 utilizing well-biasing. In the example shown, a weak pull-up PMOS transistor 33 and a weak pull-down NMOS transistor 35 are coupled in series between VDD and ground, with their respective gate terminals coupled to a first inverter of pre-driver 26. The drain terminal junction of PMOS transistor 33 and N-well transistor 35 is coupled to an n-well of clamp transistor 25. During an ESD event, NMOS transistor 35 may be activated, and may provide a weak pull-down between the N-well of clamp transistor 25 and ground. This may reduce the threshold voltage of clamp transistor 25 (thereby enabling faster activation). The lower threshold voltage may also result in an increase in the drain-source current through clamp transistor 25 when it is active. During a normal mode of operation (no ESD event), PMOS transistor 33 may be active, providing a weak pull-up that may bias the n-well toward Vdd and result in both a higher voltage threshold for clamp transistor 25 as well as a reduced leakage current. It is noted that if a well is available (e.g., for a deep N-well process), the concept above may be extended to NMOS devices. In some processes, NMOS devices may have a well and thus the well-biasing operation may also be used with NMOS devices.

Figure 4A:
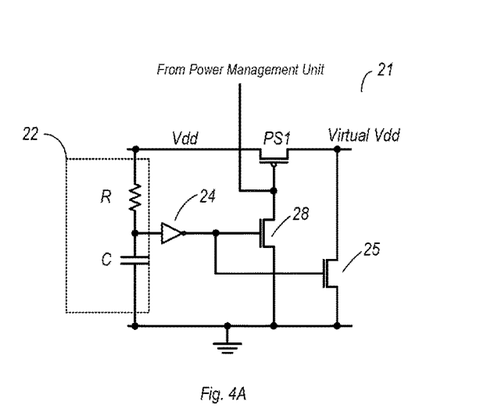
FIGS. 4A, 4B, and 4C are schematic diagrams of different embodiments of ESD protection circuits in which the clamp transistors are implemented in a gated power domain.
Figure 4B:
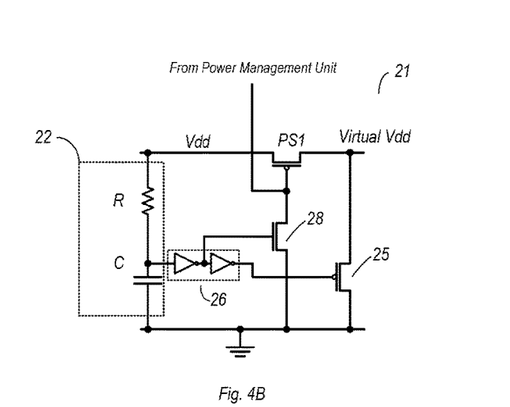
Figure 4C:
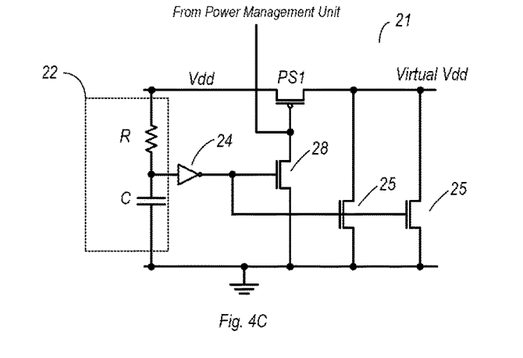

FIGS. 4A, 4B, and 4C are schematic diagrams of different embodiments of ESD protection circuits in which the clamp transistors are implemented in a gated power domain. In particular, FIGS. 4A, 4B, and 4C illustrate three different embodiments of ESD circuit 21, which includes a clamp transistor 25 in a gated power domain while the respective sensor 22 and pre-driver (24 or 26) are in the global power domain. The operation of each of these embodiments will be apparent upon reading the description of FIGS. 2, 3A, and 3B above.

FIG. 4A illustrates an embodiment of an ESD circuit 21 that implements clamp transistor 25 as an NMOS device and includes a pre-driver 24. FIG. 4B illustrates an embodiment of an ESD circuit 21 that implements clamp transistor 25 as a PMOS device and includes a pre-driver 26.

In FIG. 4C, the pre-driver 24 is coupled to drive two instances of clamp transistor 25, implemented here as NMOS devices, although a similar embodiment with PMOS devices is also possible and contemplated. In general, area savings may be achieved in some embodiments by arranging a sensor/pre-driver combination to drive multiple instances of a clamp transistor 25. Such embodiments may also enable additional area savings by enabling the individual clamp transistors to be consume less area in comparison to embodiments in which a single clamp transistor is used. Effectively, such embodiments may trade one large clamp transistor 25 for a number of smaller clamp transistors 25. The smaller clamp transistors 25 may be easier to place during layout of the design, and may also be less demanding on power and ground nodes (more generally, power and reference nodes).

Figure 5:
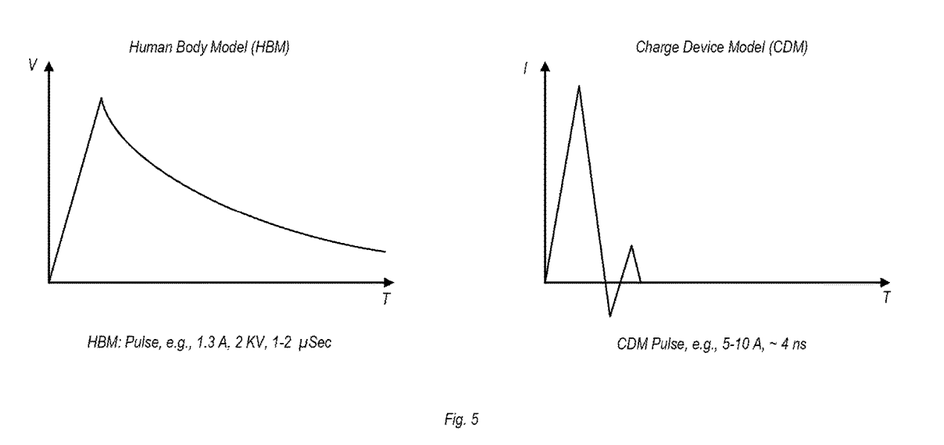
FIG. 5 is a graphic illustration of different responses for one embodiment of an HBM sensor and one embodiment of a CDM sensor.

FIG. 5 is a graphic illustration of different responses for one embodiment of an HBM sensor and one embodiment of a CDM sensor. To safely discharge the current from an ESD event, two factors may be considered during the design of an ESD circuit. The first of these is that the clamping transistor (s) are active for a sufficient duration to discharge the current. The second of these is that the ESD circuits are able to handle the stress from the voltages and currents resulting from an ESD event.

As noted above, some ESD circuits disclosed herein may be designed in accordance with the HBM, while others may be designed in accordance with the CDM. Additional models as a basis for the design of ESD circuits may be utilized for the various embodiments discussed herein. For example, the machine model (MM) may be used as a basis for ESD circuit design for embodiments contemplated herein. Other models by which circuits may be designed include the electrical over stress (EOS) model, the IEC6100-4-2 model (IEC: International Electromechanical Commission), the transmission line pulse (TLP) model, cable discharge event model, and so forth. In general, the disclosure presented herein contemplates the use of any of the ESD models explicitly mentioned herein as a basis for sensor circuit design, as well as those that are not mentioned herein. Accordingly, while much of the discussion herein focuses on the use of sensor circuits that are HDM-based or CDM-based, such discussions are not intended to limit the scope of the disclosure to only these models.

The primary difference between ESD circuits designed according to the HBM and CDM models are the RC time constants of the sensors. Sensors designed according to the HBM may be most suitable for ESD events resulting from interactions with human beings. Sensors designed according to the CDM may be most suitable for ESD events resulting from contact with another charged surface. As shown in the HBM graph in FIG. 5, a pulse from a sensor an HBM-based ESD circuit may be (relative to a CDM-based ESD circuit) large in voltage, smaller in current, and significantly longer in time. In the HBM example given in FIG. 5, the pulse has a voltage magnitude of 2 kV, a peak current of 1.3 A, and a duration of 1-2 microseconds (μsec). Accordingly, a sensor for an HBM ESD circuit may have a large RC time constant. In contrast, in a CDM ESD circuit, the peak current may be relatively high, while the duration of the pulse may be very small. In the CDM example given in FIG. 5, the peak current may be between 5 and 10 A, while the duration of the pulse may be on the order of 4 nanoseconds (ns). Thus, a sensor for a CDM ESD circuit may have an RC time constant that is significantly smaller than that of a sensor for an HBM ESD circuit.

Thus, an IC in accordance with this disclosure may include some ESD circuits optimized for the HBM and others optimized for the CDM. In particular, the sensor for an HBM ESD circuit (hereinafter 'HBM sensor') may be designed to have an RC time constant according to the general HBM parameters discussed above. Similarly, a CDM ESD circuit (hereinafter 'CDM' sensor) may be designed to have an RC time constant according to the general CDM parameters discussed above.

Generally speaking, the RC time constant for an HBM sensor may greater than that for a CDM sensor. For some embodiments, the RC time constant for an HBM sensor may be at least one order of magnitude (factor of ten) greater than that of a CDM sensor. Furthermore, it is not uncommon that the RC time constant for an HBM sensor may be several orders of magnitude (e.g., 5-6) than that of a CDM sensor. Since the CDM sensors have much smaller time constants than the HBM sensors, the area consumed by the former may be much less as well.

Figure 6A:
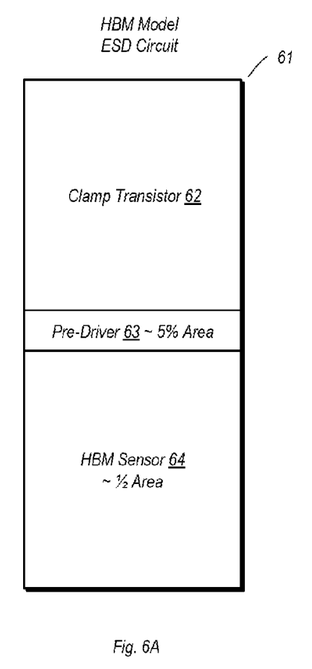
FIGS. 6A and 6B are block diagrams illustrating relative areas consumed by one embodiment of an HBM sensor-based ESD circuit and a CDM-based sensor circuit.
Figure 6B:
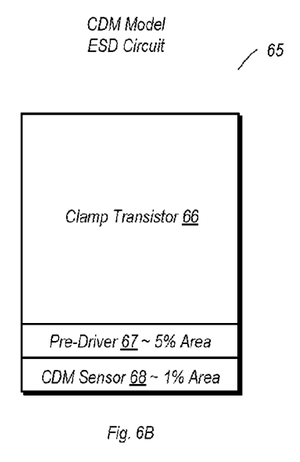

FIGS. 6A and 6B are block diagrams illustrating relative areas consumed by one embodiment of an HBM sensor-based ESD circuit and a CDM-based sensor circuit. In FIG. 6A, the area profile of one embodiment of an ESD circuit 61 having an HBM sensor is shown. Since the RC time constant of the HBM sensor 64 is relatively larger, and in this embodiment, consumes approximately one half of the area of ESD circuit 61. Pre-driver 63 may be implemented with relatively small transistors, and consumes approximately 5% of the area, while the remainder is consumed by clamp transistor 62.

For the illustrated embodiment of ESD circuit 65, which is CDM-based, the CDM sensor 68 consumes on the order of 1% of the total area due to the small RC time constant. Pre-driver 67 consumes approximately 5%, while the remainder is consumed by clamp transistor 66. Because the area consumed by the CDM sensor 68 is very small relative to the overall area consumed by CDM ESD circuit 65, the extra area cost of providing dedicated sensors for multiple instances of this circuit. Furthermore, the smaller area of the CDM sensor 68 means it will generally cause activation of clamp transistor 66 much faster relative to the speed at which HBM sensor 64 activates clamp transistor 62.

The embodiments of ESD circuits shown in FIGS. 6A and 6B may be in contrast to prior art embodiments designed neither to HBM or CDM parameters. In such prior art embodiments, the sensor circuit may consume about ⅓ of the area. The resulting RC time constant may cause the clamping transistor to turn on slower in comparison to the CDM ESD circuit 65. Furthermore, the faster discharge time of the capacitor of the prior art ESD circuit relative to the HBM ESD circuit results in the clamping transistor turning off earlier in the former relative to the latter. Accordingly, the prior art ESD circuits may not be optimized to handle ESD events that occur according to both the HBM and CDM.

Figure 7:
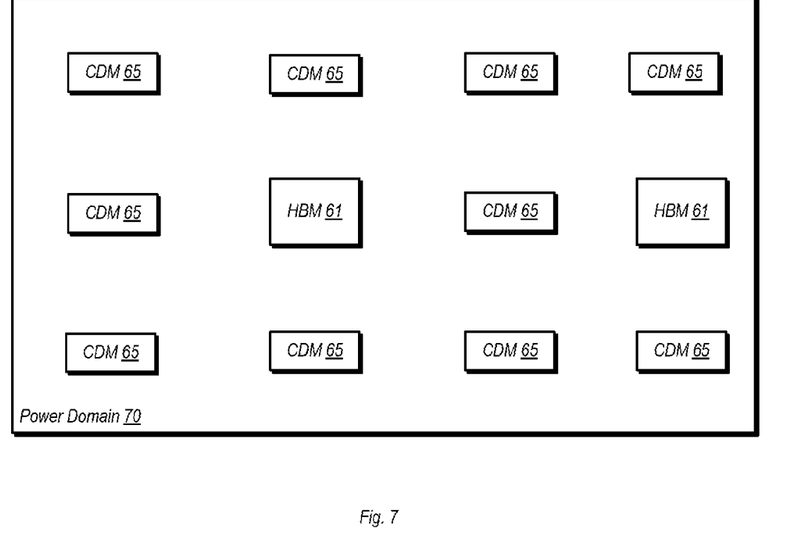
FIG. 7 is a plan view of one embodiment of a power domain having HBM and CDM sensor-based ESD circuits implemented therein.

FIG. 7 is a plan view of one embodiment of a power domain having HBM and CDM sensor-based ESD circuits implemented therein. In the embodiment shown, a number of ESD circuits 65 (CDM based) and two instances of ESD circuits 61 (HBM based) within power domain 70. Power domain 70 may be a global or gated power domain. In the case where power domain 70 is a gated power domain, the sensor and pre-driver circuits thereof may nevertheless remain in the global power domain as shown in the embodiments of, e.g., FIGS. 4A-4C above.

Generally speaking, the CDM based ESD circuits may be distributed more across the power domain 70 and IC in general and may be placed closer to the circuits which they are intended to protect. The fast response time of these circuits may enable these circuits to more quickly discharge current during an ESD event. On the other hand, the HBM based ESD circuits, due to their longer duration on time, need not be as widely distributed as CDM based ESD circuits. Thus, in various embodiments, a greater number of CDM based ESD circuits are implemented than HBM based ESD circuits, with the CDM based ESD circuits being more localized.

One other factor that may be considered when implementing the various ESD circuits discussed herein is the inrush current to a power domain. It is desirable that the inrush current not exceed a specified limit. The specified inrush current limit may be based on a power ramp value, which it the duration that it takes for a voltage node to become powered up to its full voltage from a complete power down state. The total inrush current by all ESD circuits may be determined as follows:

Total Inrush Current(ESD)=(#HBM×inrush/HBM)+ (#CDM×inrush/CDM).

Thus the total inrush current is determined by the number of HBM ESD circuits times the inrush current per HBM ESD circuit plus the number of CDM ESD circuits times the inrush current per CDM ESD circuit. Accordingly, during the design, a balancing of the power ramping of a power domain and the number and type of ESD circuits implemented therein may be performed. The larger number of CDM ESD clamps may allow for lower power ramp times to be considered (e.g., implementing a majority of the ESD circuits as CDM with 2 ns RC time constant may allow for a power ramp of a few μsec to the low 10's of μsec).

It should be noted that specific time constant figures (e.g., the 2 ns figure from the previous paragraph) given herein are exemplary and presented for the purposes of illustration. However, these figures are not intended to be limiting, and a wide range of RC time constants for each type of circuit is possible and contemplated.

Figure 8:
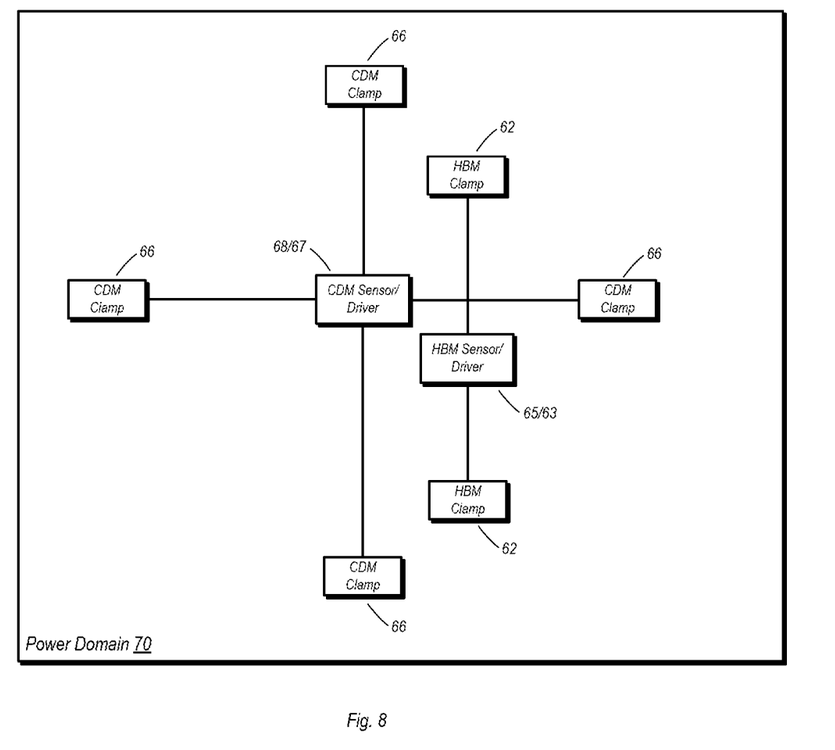
FIG. 8 is a plan view of another embodiment of a power domain having HBM and CDM sensor-based ESD circuits implemented therein.

FIG. 8 is a plan view of another embodiment of a power domain having HBM and CDM sensor-based ESD circuits implemented therein. In this particular embodiment, power domain 70 includes a number of clamp transistors 62 and 66, with a majority of the clamp transistors being coupled to be triggered by a CDM sensor/driver combination. In particular, a CDM sensor 68 and correspondingly coupled pre-driver 67 may drive four different CDM clamp transistors in this embodiment. An HBM sensor 64 and corresponding pre-driver 63 may drive two different HBM clamp transistors 62. Thus, similar to the embodiment shown in FIG. 4C, a single sensor/driver combination may drive multiple instances, and thus realize some area savings. The area savings may be more pronounced with the HBM based ESD circuits due to the larger resistors and capacitors used to obtain the larger RC time constant.

Figure 9:
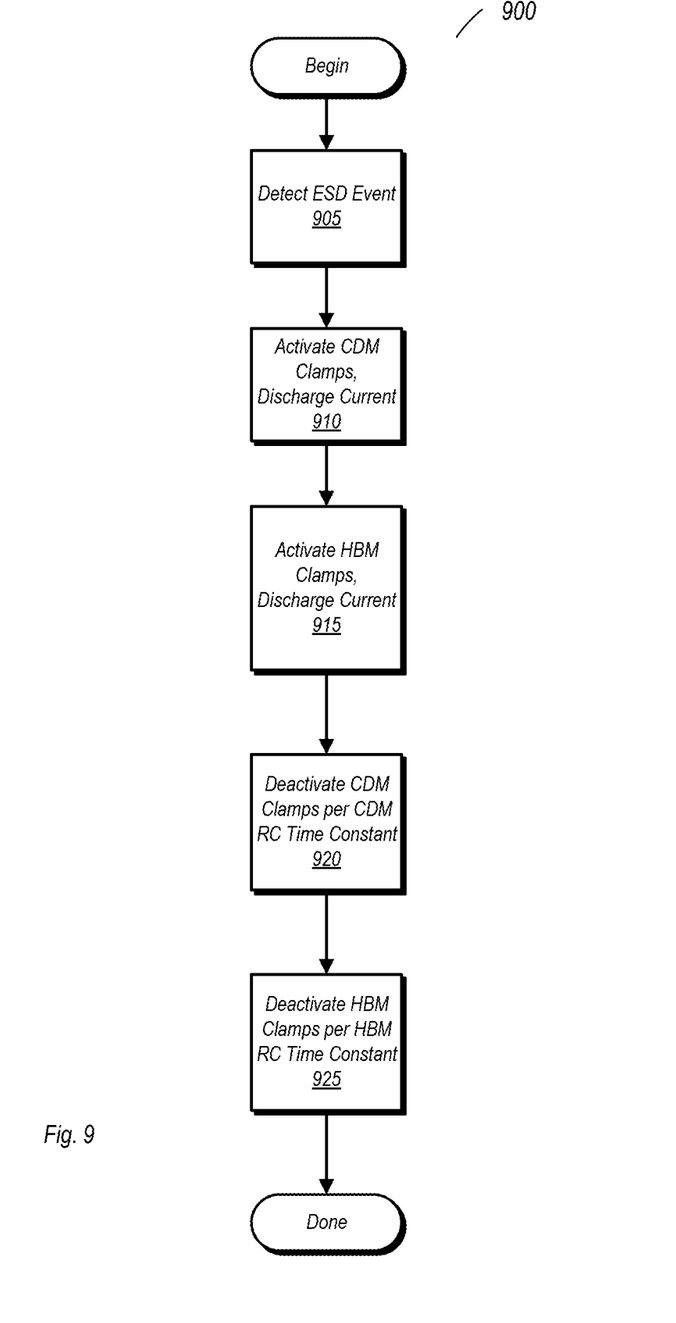
FIG. 9 is a flow diagram of one embodiment of a method for detecting an ESD event and discharging the current generated thereby.

FIG. 9 is a flow diagram of one embodiment of a method for detecting an ESD event and discharging the current generated thereby. Method 900 may be utilized using various ones of the circuit embodiments discussed above, as well as with embodiments not explicitly discussed herein. In general, method 900 may be utilized with various embodiments that include ESD circuits optimized according to the HBM and ESD circuits optimized according CDM.

Method 900 begins with the detection of an ESD event by the various sensor circuits implemented in a power domain of an IC (block 905). The power domain may be a gated power domain or a global power domain. Responsive to detection of the ESD event, a number of CDM based sensors may detect the event and activate their respective clamp transistors (block 910). As discussed above, the CDM based sensors may have a small RC time constant, and thus their respective clamp transistors may be activated relatively quickly. Once activated, the clamp transistors associated with the CDM based sensors may begin discharging current.

Method 900 continues with the HBM sensors causing activation of their respective clamp transistors (block 915). In some embodiments, the activation of the HBM sensors may occur substantially simultaneously with that of the CDM sensors. In other embodiments, the HBM sensors may activate subsequent to the CDM sensors. Due to their relatively larger RC time constant, the HBM sensors may be slower (relative to the CDM sensors) to cause de-activation of their corresponding clamp transistors, and thus these transistors may discharge current for a longer duration than their counterparts coupled to CDM sensors.

After a relatively short duration (due to their small RC time constant), the CDM sensors may cause deactivation of their respective clamp transistors (block 920). The clamp transistors associated with the HBM sensors may remain on for a significantly longer duration before deactivation (block 925) due to their larger RC time constant. Generally speaking, the clamp transistors associated with the CDM sensors may discharge a large amount of current for a short duration, while the clamp transistor associated with the HBM transistors may discharge current (with a lower peak current relative to the CDM ESD circuits) for a longer duration.

Figure 10:
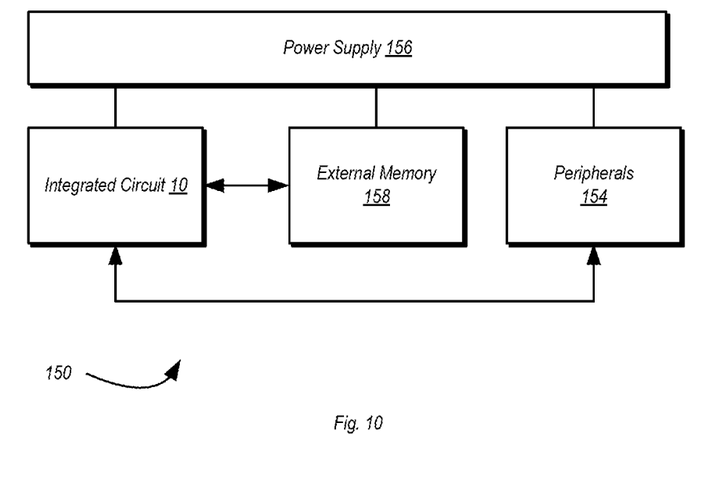
FIG. 10 is a block diagram of one embodiment of an exemplary system.

Turning next to FIG. 10, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a first sensor circuit;
   a second sensor circuit, wherein each of the first and second sensor circuits are configured to detect an electro-static discharge (ESD) event; and
   first and second clamp transistors configured to be activated by the first and second sensor circuits, respectively, responsive to detection of the ESD event;
   wherein a resistive-capacitive (RC) time constant of the first sensor circuit is greater than an RC time constant of the second sensor circuit;
   wherein at least one of the first and second clamp transistors is coupled to well-biasing circuitry, wherein the well-biasing circuitry includes a pull-up transistor and a pull-down transistor coupled together and further coupled to a well of the clamp transistor, wherein the well-biasing circuitry is configured to bias a threshold voltage of the clamp transistor.

2. The apparatus as recited in claim 1, wherein the first and second sensor circuits are implemented in a global power domain, and wherein the first and second clamp transistors are implemented in a gated power domain.

3. The apparatus as recited in claim 2, further comprising first and second power switches coupled between the global power domain and the gated power domain, wherein the first and second sensor circuits are configured to cause activation of the first and second power switches, respectively, responsive to the ESD event.

4. The apparatus as recited in claim 1, wherein the first sensor circuit is a first type of sensor circuit and the second sensor circuit is a second type of sensor circuit, wherein the circuit further comprises multiple instances of the second type of sensor circuit for each instance of the first type of sensor circuit.

5. The apparatus as recited in claim 1, wherein the first sensor circuit includes a first pre-driver circuit coupled to a gate terminal of the first clamp transistor and wherein the second sensor circuit includes a second circuit coupled to a gate terminal of the second clamp transistor.

6. The apparatus as recited in claim 1, wherein the first sensor circuit is configured to activate, responsive to detection of the ESD event, each of a first plurality of clamp transistors, the first plurality of clamp transistors including the first clamp transistor, and wherein the second sensor circuit is configured to, responsive to detection of the ESD event, activate each of a second plurality of clamp transistors, the second plurality of clamp transistors including the second clamp transistor.

7. The apparatus as recited in claim 1, further comprising:
   a first plurality of sensor circuits including the first sensor circuit;
   a first plurality of clamp transistors including the first clamp transistor, wherein each of the first plurality of sensor circuits is configured to activate a corresponding unique one of the first plurality of clamp transistors;
   a second plurality of sensor circuits including the second sensor circuit; and
   a second plurality of clamp transistors including the second clamp transistor, wherein each of the second plurality of sensor circuits is configured to activate a corresponding unique one of the second plurality of clamp transistors.

8. The apparatus as recited in claim 1, wherein the first and second sensor circuits and the first and second clamp transistors are implemented in a first power domain.

9. A method comprising:
   first and second sensor circuits each detecting an electro-static discharge (ESD) event; and
   the first and second sensor circuits activating first and second clamp transistors, respectively, responsive to detecting the ESD event, wherein a resistive-capacitive (RC) time constant of the first sensor circuit is greater than an RC time constant of the second sensor circuit;
   wherein the method further comprises biasing a threshold voltage of at least one of the first and second clamp transistors using well-biasing circuitry having a pull-up transistor and a pull-down transistor coupled together and further coupled to a well of the at least one of the first and second clamp transistors.

10. The method as recited in claim 9, further comprising:
    the first and second sensor circuits detecting the ESD event in a global power domain; and
    the first and second sensor circuits causing activation of first and second power switches coupled between the global power domain and a gated power domain, wherein the first and second clamp transistors are implemented in the gated power domain.

11. The method as recited in claim 9, further comprising:
the first sensor circuit activating each of a first plurality of clamp transistors responsive to detecting the ESD event, the first plurality of clamp transistors including the first clamp transistor; and
the second sensor circuit activating each of a second plurality of clamp transistors responsive to detecting the ESD event, the second plurality of clamp transistors including the second clamp transistor.

12. The method as recited in claim 9, further comprising, subsequent to activating the first and second clamp transistors, the second sensor circuit deactivating the second clamp transistor prior to the first sensor circuit deactivating the first clamp transistor.

13. An integrated circuit comprising:
a charged device model (CDM) sensor configured to detect an electro-static discharge (ESD) event, the CDM sensor circuit having a first resistive-capacitive (RC) time constant;
a first transistor coupled to the CDM sensor, wherein the CDM sensor is configured to cause activation of the first transistor responsive to detecting the ESD event;
a human body model (HBM) sensor, the HBM sensor circuit having a second RC time constant that is at least one order of magnitude greater than the first RC time constant; and
a second transistor coupled to the HBM sensor, wherein the HBM sensor is configured to cause activation of the second transistor responsive to detecting the ESD event;
wherein at least one of the first and second transistors is coupled to well-biasing circuitry, wherein the well-biasing circuitry includes a pull-up transistor and a pull-down transistor coupled together and further coupled to a well of the at least one of the first and second transistors, wherein the well-biasing circuitry is configured to bias a threshold voltage of the at least one of the first and second transistors.

14. The integrated circuit as recited in claim 13, wherein responsive to detecting the ESD event, the CDM sensor is configured to activate the first transistor prior to the HBM sensor activating the second transistor, and wherein the HBM sensor is configured to deactivate the second transistor subsequent to the CDM sensor deactivating the first transistor.

15. The integrated circuit as recited in claim 13, wherein the CDM and HBM sensors are implemented in a global power domain, and wherein the first and second transistors are implemented in a gated power domain.

16. The integrated circuit as recited in claim 15, wherein responsive to detecting the ESD event, the CDM sensor is configured to cause activation of a first power switch and wherein the HBM sensor is configured to cause activation of a second power switch, wherein the first and second power switches are coupled between the global power domain and the gated power domain.

17. The integrated circuit as recited in claim 16, further comprising a power control circuit configured to cause activation of the first and second power switches independent of activation of the first and second transistors.

18. The integrated circuit as recited in claim 13, wherein the CDM sensor is configured to activate each of a first plurality of transistors responsive to detecting the ESD event, wherein the first plurality of transistors includes the first transistors, and wherein the HBM sensor is configured to activate each of a second plurality of transistors responsive to detecting the ESD event, wherein the second plurality of transistors includes the second transistor.

19. The integrated circuit as recited in claim 13, further comprising a plurality of CDM sensors each configured to activate a corresponding unique one of a first plurality of transistors responsive to detecting the ESD event, and a plurality of HBM sensors each coupled to activate a corresponding unique one of a second plurality of transistors responsive to detecting the ESD event.

* * * * *